(12) United States Patent
Shiina

(10) Patent No.: US 9,059,697 B2
(45) Date of Patent: Jun. 16, 2015

(54) DRIVE CIRCUIT AND DRIVE METHOD FOR DRIVING NORMALLY-ON-TYPE TRANSISTOR

(71) Applicant: FUJITSU SEMICONDUCTOR LIMITED, Yokohama-shi, Kanagawa (JP)

(72) Inventor: Yoshiomi Shiina, Yokohama (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/229,332

(22) Filed: Mar. 28, 2014

(65) Prior Publication Data

US 2014/0300394 A1 Oct. 9, 2014

(30) Foreign Application Priority Data

Apr. 8, 2013 (JP) ................................. 2013-080261

(51) Int. Cl.
*H03K 3/00* (2006.01)
*H03K 19/00* (2006.01)
*H03K 17/0812* (2006.01)

(52) U.S. Cl.
CPC ...... *H03K 19/0019* (2013.01); *H03K 17/08122* (2013.01); *H03K 2217/0081* (2013.01)

(58) Field of Classification Search
CPC ..... H03K 3/00; H03K 3/012; H03K 19/0019; H03K 17/08122; H03K 2217/0081
USPC .................................................. 327/108, 112
See application file for complete search history.

(56) References Cited

U.S. PATENT DOCUMENTS 6,097,220 A * 8/2000 Huang ............................. 326/88
7,977,981 B2 * 7/2011 Wilson et al. .................. 327/108

FOREIGN PATENT DOCUMENTS

JP 10-276076 A 10/1998
JP 2006-324839 A 11/2006

* cited by examiner

*Primary Examiner* — Kenneth Wells
(74) *Attorney, Agent, or Firm* — Arent Fox LLP

(57) ABSTRACT

A drive circuit including a second switching element that is connected in series to a source of a first switching element, that is switched ON when the first switching element is switched ON, and that is switched OFF when the first switching element is switched OFF. The drive circuit includes a conduction element that is provided between a drain of the second switching element and a power line, and that connects the drain of the second switching element to the power line in accordance with a signal that switches the second switching element OFF.

14 Claims, 10 Drawing Sheets

DRIVE CIRCUIT AND DRIVE METHOD FOR DRIVING NORMALLY-ON-TYPE TRANSISTOR

CROSS-REFERENCE TO RELATED APPLICATION

This application is based upon and claims the benefit of priority of the prior Japanese Patent Application No. 2013-080261, filed on Apr. 8, 2013, the entire contents of which are incorporated herein by reference.

FIELD

The embodiments discussed herein are related to a drive circuit, a semiconductor integrated circuit, and to a control method of a drive circuit.

BACKGROUND

Compound semiconductors include group III-V compound semiconductors such as gallium nitride (GaN), and group IV-IV compound semiconductors such as SiC. Switching elements that employ compound semiconductors include normally-on-type switches in which drain current flows when no negative gate voltage is applied, and in which drain current is interrupted when a negative gate voltage is applied.

In an inverting amplifier employing a field effect transistor (FET) with negative threshold voltage, an inverting amplifier circuit is formed as a series circuit from a FET with negative threshold voltage and a FET with positive threshold voltage. In the inverting amplifier circuit, the positive threshold voltage FET is connected to the low voltage side of the negative threshold voltage FET, and both FETs are switched ON by increasing the input voltages to the respective FET gates. By setting the input voltage to 0V, the positive threshold voltage FET is switched OFF. Configuration is thereby made such that the electrical potential of the source of the negative threshold voltage FET increases, and the negative threshold voltage FET is switched OFF, in accordance with a voltage equalizing resistor.

A compound semiconductor device is cascode-connected to a normally-on switching element and a normally-off switching element. In the compound semiconductor device the gate of the normally-on switching element is connected to the source of the normally-off switching element, and the compound semiconductor device is normally-off driven in accordance with a gate signal from the normally-off switching element.

The switching elements that use high voltage power source switching, such as those referred to as power transistors, are formed in a specific package. The leads formed in the package are connected for example to a board. There is significant parasitic inductance in wiring such as of the leads. Therefore, in the drive circuits of the normally-on switching elements, when the normally-off switching elements are off, an overpotential may be generated across the drain-source of the normally-off switching elements.

In the compound semiconductor device, across the drain-gate or across the drain-source of the normally-off switching elements, a voltage clamping mechanism is provided that uses a Zener diode or a capacitor.

Related Patent Documents

Japanese Patent Application Laid-Open No. 10-276076
Japanese Patent Application Laid-Open No. 2006-324839

SUMMARY

According to one or more aspect of the embodiments, a drive circuit includes: a second switching element configured to be connected in series to a source of a first switching element, configured to be switched ON when the first switching element is switched ON, and configured to be switched OFF when the first switching element is switched OFF; and a conduction element configured to be provided between a drain of the second switching element and a power line, and configured to connect the drain of the second switching element to the power line in accordance with a signal that switches the second switching element OFF.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Detailed explanation follows regarding an example of technology disclosed herein, with reference to the drawings.

First Exemplary Embodiment

Figure 1:
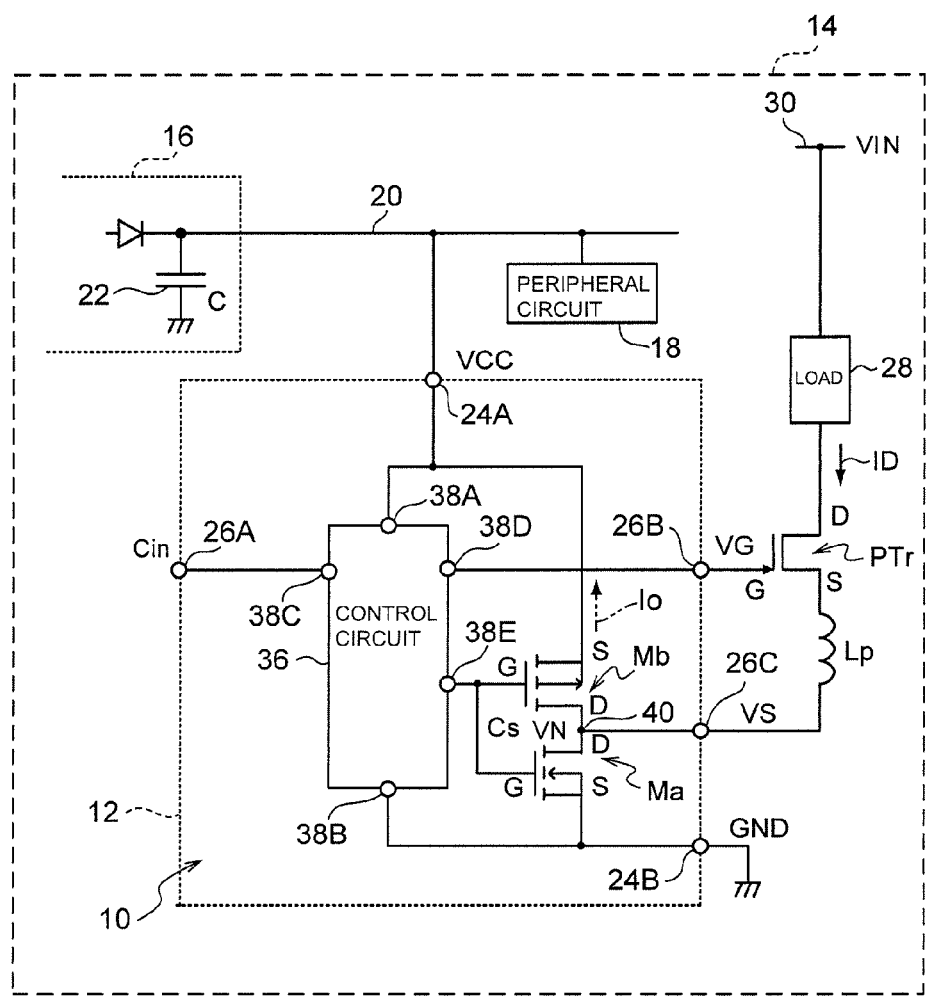
FIG. 1 is a circuit diagram illustrating an example of a drive circuit of a first exemplary embodiment.

FIG. 1 illustrates a drive circuit 10 according to the first exemplary embodiment. The drive circuit 10 is formed to an integrated circuit 12. The drive circuit 10 is used to drive a power transistor PTr. The drive circuit 10 functions as an example of a drive circuit in the first exemplary embodiment, and the integrated circuit 12 functions as an example of a semiconductor integrated circuit in the first exemplary embodiment. The power transistor PTr functions as an example of a first switching element in the first exemplary embodiment.

The integrated circuit 12 is, for example, attached to a base board 14. The base board 14 is provided with a direct current power source section 16 that outputs direct current power at a specific voltage (for example 5V, referred to below as voltage VCC). A various function circuit (referred to below as a peripheral circuit) 18 operated by power of the voltage VCC is provided to the base board 14. The peripheral circuit 18 is connected to the direct current power source section 16 through a power source line (referred to below as power line) 20, and is supplied and operated by voltage VCC power from the direct current power source section 16.

Note that the integrated circuit 12 may be configured including plural drive circuits 10. The integrated circuit 12 may be configured to include the direct current power source section 16, and to convert externally supplied direct current power at a specific voltage to the drive voltage (voltage VCC) of the drive circuit 10 using the direct current power source section 16. The integrated circuit 12 may moreover be configured including plural peripheral circuits 18.

The direct current power source section 16 is applied to a power circuit of a general configuration including a capacitor 22 of a specific static capacitance C. One end of the capacitor 22 is connected to the power line 20, and the other end is connected to ground, and is equipped with a function to achieve power smoothing of the voltage VCC output from the direct current power source section 16 to the power line 20.

The drive circuit 10 provided to the integrated circuit 12 is equipped with a power source terminal 24A and a ground terminal 24B. In the drive circuit 10, the power source terminal 24A is connected to the power line 20, and the ground terminal 24B is connected to ground (GND).

The drive circuit 10 includes an input terminal 26A, an output terminal 26B and an output terminal 26C. Note that the power source terminal 24A, the ground terminal 24B, the input terminal 26A, the output terminals 26B, 26C function as terminals of the integrated circuit 12.

In the first exemplary embodiment, as an example, an N-type power transistor PTr is employed. In the first exemplary embodiment the power transistor PTr is a normally-on-type. The power transistor PTr is connected to the drive circuit 10. The gate G of the power transistor PTr is connected to the output terminal 26B of the drive circuit 10, and the source S of the power transistor PTr that is the low voltage side electrode is connected to the output terminal 26C of the drive circuit 10. In the drive circuit 10, a drive signal Cin is input to the input terminal 26A for switching driving of the power transistor PTr.

A load 28 is connected to a drain D that is the high voltage side electrode of the power transistor PTr. The load 28 is connected to a power line 30 of a specific high voltage for comparison to voltage VCC (for example a predetermined voltage of over 100 V up to a several hundreds of volt, referred to below as voltage VIN). The drive circuit 10 interrupts power supply to the load 28 by switching operation of the power transistor PTr.

A voltage transformer is, for example, employed as the load 28. A drain current ID is made to flow into the load 28 by switching ON the power transistor PTr, and the drain current ID is stopped by switching OFF the power transistor PTr. The load 28 outputs a voltage, that accords with the voltage VIN supplied to the primary side and its turns ratio, from the secondary side by ON/OFF switching of the drain current ID. Thus when a voltage transformer is employed as the load 28, the drive circuit 10 and the power transistor PTr function as part of a high voltage power circuit.

Note that the power transistor PTr may be applied to the load 28 of any suitable function. According to the load 28, the drive circuit 10 and the power transistor PTr function as, for example, a high voltage inverter circuit, a part of a high output signal amplification circuit or the like. The power transistor PTr is configured with a withstand voltage in accordance with the voltage VIN.

Transistors using various compound semiconductors may be applied as the power transistor PTr of normally-on-type. For example, gallium nitride High Electron Mobility Transistor (GaN HEMT) that employs gallium nitride (GaN), a group III-V compound semiconductor, may be employed as the power transistor PTr. Moreover, a SiC Junction Field Effect Transistor (SiC JEFT) that employs silicon carbide (SiC), a group IV-IV compound semiconductor, may be employed as the power transistor PTr. Note that the power transistor PTr is not limited to a compound semiconductor, and may be a Bipolar Junction Transistor (BJT). The power transistor PTr may also be a Metal Oxide Silicon Field Effect Transistor (MOSFET), and may also be an Insulated Gate Bipolar Transistor (IGBT).

Figure 2:
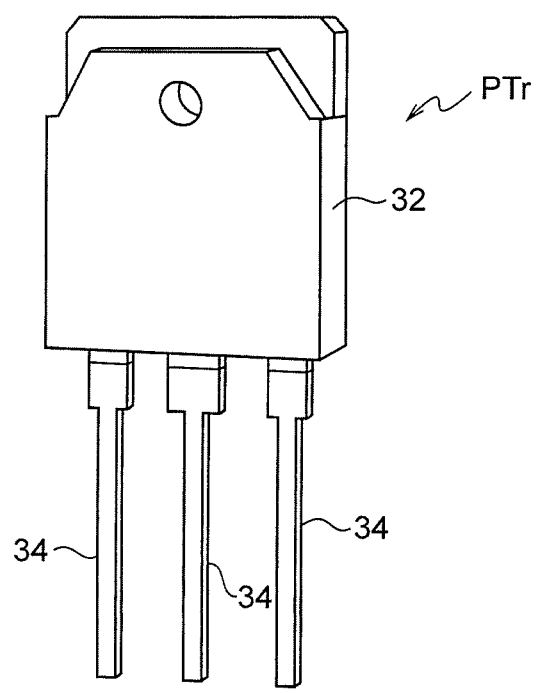
FIG. 2 is a perspective view illustrating relevant portions of an example of a power transistor package.

FIG. 2 illustrated an example of the power transistor PTr. The power transistor PTr is, for example, formed within a specific package 32, such as a TO-3 P. Plural leads 34 are formed to the package 32, corresponding to the drain D, the source S and the gate G respectively. The power transistor PTr is attached such as by fixing the specific package 32 to the base board 14. Each of the leads 34 is connected to the wiring pattern on the base board 14 and the terminals of the integrated circuit 12 by for example wire bonding. The leads 34 function as part of wiring in the first exemplary embodiment. Note that the power transistor PTr is not limited to the TO-3 P package 32 and may be applied as a power transistor PTr formed to any suitable package.

As illustrated in FIG. 1, the drive circuit 10 includes a control circuit 36. The control circuit 36 includes a power source terminal 38A and a ground terminal 38B. In the control circuit 36, the power source terminal 38A is connected to the power source terminal 24A of the drive circuit 10, and the ground terminal 38B is connected to the ground terminal 24B of the drive circuit 10, such that the control circuit 36 is driven by voltage VCC input to the power source terminal 24A.

The control circuit 36 includes an input terminal 38C, and output terminals 38D, 38E. In the control circuit 36 the input terminal 38C is connected to the input terminal 26A of the drive circuit 10. In the control circuit 36 the output terminal 38D is connected to the output terminal 26B of the drive circuit 10.

The control circuit 36 controls the electrical potential of the gate G of the power transistor PTr (referred to below as gate voltage VG) by outputting from the output terminal 38D a voltage (referred to below as control voltage Vc) in accordance with the drive signal Cin input from the input terminal 38C.

A transistor Ma is provided in the drive circuit 10. The transistor Ma functions as a second switching element in the first exemplary embodiment. The transistor Ma is configured by an N-type MOSFET, and is a normally-off-type.

The source S of the transistor Ma is connected to a ground terminal 24B of the drive circuit 10. The drain D of the transistor Ma is connected to a node 40, and the node 40 is connected to the output terminal 26C of the drive circuit 10. In the drive circuit 10, the normally-off-type transistor Ma is connected to the low voltage side of the normally-on-type power transistor PTr in what is referred to as a cascode connection.

The gate G of the transistor Ma is connected to the output terminal 38E of the control circuit 36. The control circuit 36 outputs a control signal Cs from the output terminal 38E to ON/OFF drive the transistor Ma. The drive circuit 10 controls the electrical potential (referred to below as source voltage VS) of the source S of the power transistor PTr by driving the transistor Ma using the control signal Cs output from the control circuit 36.

The normally-on-type power transistor PTr is configured with a negative threshold voltage Vth of the gate G. A negative threshold voltage is indicated below by −Vth (−Vth<0V, for example −Vth=−1.0V). When in the normally-on-type power transistor PTr the source voltage VS of the source S is 0V, for example, the voltage VG of the gate G is in an ON state at 0V or above. The normally-on-type power transistor PTr is switched OFF when the gate voltage VG is lower than the threshold value −Vth (VG<−Vth<0V).

Namely, the normally-on-type power transistor PTr is switched OFF when the electrical potential of the gate G with respect to the source S (referred to below as the relative-to-source voltage VGS) is the threshold value −Vth or lower (VGS≤−Vth<0). The drive circuit 10 controls the relative-to-source voltage VGS of the power transistor PTr by controlling the gate voltage VG and the source voltage VS of the power transistor PTr, and thereby ON/OFF drives the power transistor PTr.

A transistor Mb is provided in the drive circuit 10. The transistor Mb is, similarly to the transistor Ma, formed to the integrated circuit 12. The transistor Mb functions as an example of a conduction element in the first exemplary embodiment. The transistor Mb also functions as a third switching element in the first exemplary embodiment.

The transistor Mb is a normally-off-type, and employs a P-type MOSFET that complements the transistor Ma. The drain D that is the low voltage side electrode of the transistor Mb is connected to the node 40, and the source S that is the high voltage side electrode is connected to the power source terminal 24A.

The gate G of the transistor Mb is connected to the output terminal 38E of the control circuit 36. In the drive circuit 10, each of the gates G of each of the complementary transistors Ma, Mb is connected to the output terminal 38E of the control circuit 36. The drive circuit 10 operates such that when one of the transistors Ma, Mb is switched ON by the control signal Cs, the other of the transistors Ma, Mb is switched OFF.

In the ON state the transistor Mb places the power line 20 and the drain D of the transistor Ma in a conducting state. By switching ON the transistor Mb, the drive circuit 10 maintains (clamps) a voltage VN of the node 40 connected to the source S of the power transistor PTr at voltage VCC. The voltage VN of the gate 40 corresponds to the source voltage VS of the power transistor PTr. The drive circuit 10 accordingly clamps the source voltage VS of the power transistor PTr to voltage VCC by switching ON the transistor Mb.

Figure 3:
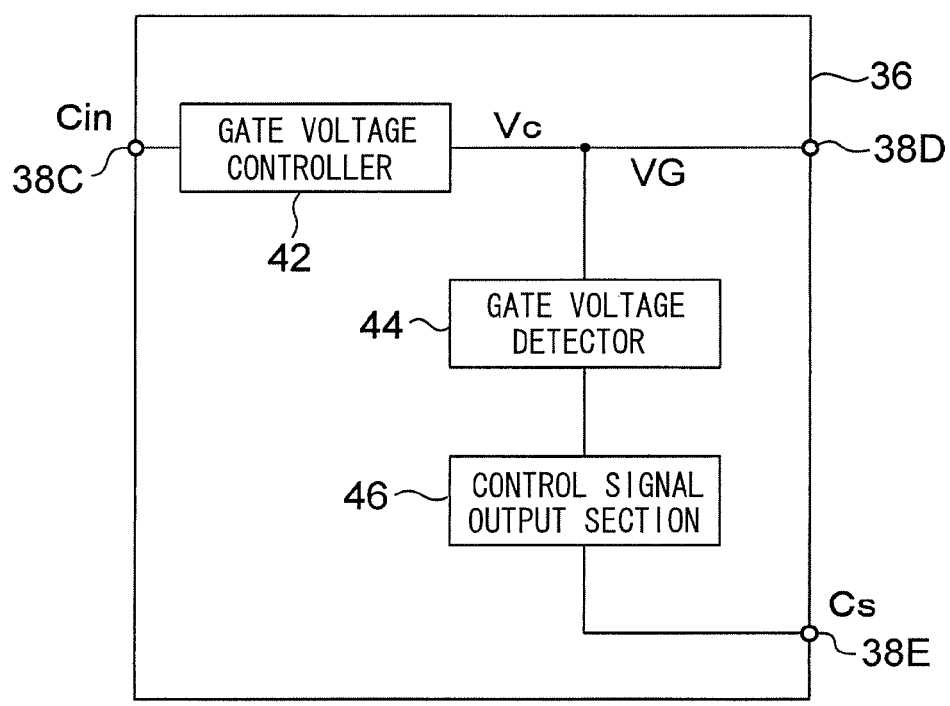
FIG. 3 is a functional block diagram illustrating an example of a control circuit according to the first exemplary embodiment.

FIG. 3 illustrates an example of the control circuit 36. The control circuit 36 includes a gate voltage controller 42, a gate voltage detector 44 and a control signal output section 46. On input of the drive signal Cin, the gate voltage controller 42 outputs the control voltage Vc corresponding to the drive signal Cin. For example, when the drive signal Cin becomes "H" level so as to switch ON the power transistor PTr, the gate voltage controller 42 steps up the control voltage Vc to voltage VH (for example, VH=VCC). Due to the control voltage Vc becoming voltage VH (Vc=VH), the gate voltage VG of the power transistor PTr is stepped up to voltage VH (VG=VH).

Moreover, when the drive signal Cin becomes "L" level so as to switch OFF the power transistor PTr, the gate voltage controller 42 steps down the control voltage Vc to voltage VL (for example, VL=0V) (Vc=VL). Due to the control voltage Vc being lowered to voltage VL, the gate G is discharged, and the gate voltage VG of the power transistor PTr is lowered so as to become voltage VL (VG=VL). Note that in the following explanation, as an example, voltage VH=VCC, and voltage VL=0V.

The gate voltage detector 44 detects a gate voltage VG that fluctuates in accordance with the control voltage Vc. Based on the gate voltage VG detected by the gate voltage detector 44, the control signal output section 46 outputs a control signal Cs from the output terminal 38E. For example, when the gate voltage VG detected by the gate voltage detector 44 falls to voltage VL (0V), the control signal output section 46 outputs the control signal Cs (L level) so as to switch the transistor Ma OFF and to switch the transistor Mb ON. Also when the gate voltage VG detected by the gate voltage detector 44 rises to voltage VH, the control signal output section 46 outputs the control signal Cs (H level) so as to switch the transistor Ma ON, and the transistor Mb OFF.

By lowering the source voltage VS of the power transistor PTr when the gate voltage VG of the power transistor PTr is stepped up, the drive circuit 10 raises the relative-to-source voltage VGS of the gate G, and switches the power transistor PTr ON. Moreover, by stepping up the source voltage VS of the power transistor PTr when the gate voltage VG of the power transistor PTr has fallen, the drive circuit 10 makes the relative-to-source voltage VGS of the gate G lower than the threshold value −Vth. The power transistor PTr is switched OFF by the relative-to-source voltage VGS of the gate G becoming lower than the threshold value −Vth.

Figure 4:
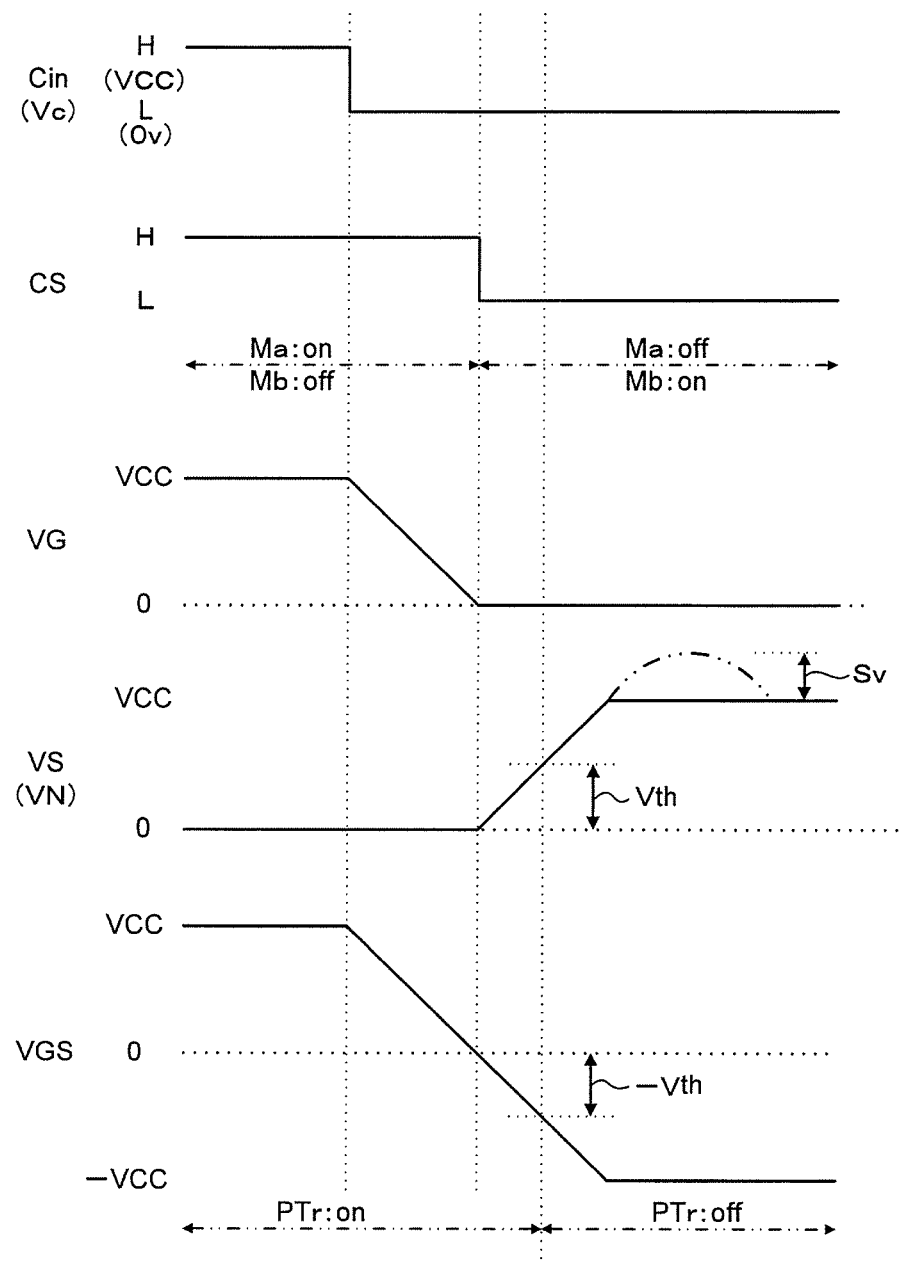
FIG. 4 is a timing chart illustrating an example of the actuation of a drive circuit according to the first exemplary embodiment.

Explanation follows regarding operation of the drive circuit 10 with reference to FIG. 4, as an example of operation of the first exemplary embodiment. Note that FIG. 4 is an expanded view, particularly on the time axis. Moreover, in FIG. 4, the control voltage Vc output based on the drive signal Cin, and the source voltage VS corresponding to the voltage VN of the node 40 are indicated in brackets.

The control circuit 36 provided to the drive circuit 10 steps up the control voltage Vc to voltage VCC when the drive signal Cin becomes H level. The gate voltage VG of the power transistor PTr is stepped up to voltage VCC in accordance with the control voltage Vc. The control signal output section 46 makes the control signal Cs "H" level when the gate voltage VG becomes greater than 0V (for example VG=VCC). In the drive circuit 10, the transistor Ma is switched ON and the transistor Mb is switched OFF when the control signal Cs becomes "H" level. The source S of the power transistor PTr is connected to ground by switching ON the transistor Ma, the relative-to-source voltage VGS of the gate G becomes voltage VCC, and an ON state of the power transistor PTr continues.

The control circuit 36 of the drive circuit 10 makes the control voltage Vc output to the gate G of the power transistor PTr 0V when the drive signal Cin becomes "L" level. As illustrated in FIG. 4, the gate voltage VG of the power transistor PTr falls to 0V when the control voltage Vc becomes 0V. In the control circuit 36, the control signal output section 46 makes the control signal Cs "L" level when the gate voltage VG detected by the gate voltage detector 44 falls to 0V (VG=0V).

In the drive circuit 10, the transistor Ma is switched OFF and the transistor Mb is switched ON when the control signal Cs becomes "L" level. The drive circuit 10 makes current flow from the power line 20 to the source S of the power transistor PTr through the transistor Mb by switching ON the transistor Mb. The source voltage VS of the power transistor PTr is stepped up by current flowing from the power line 20 to the source S. Moreover, the source voltage VS of the power transistor PTr is clamped to voltage VCC.

Due to the source voltage VS being stepped up in the state in which the gate voltage VG of the power transistor PTr is lowered to 0V (VG=0V), the relative-to-source voltage VGS of the gate G of the power transistor PTr becomes negative. Due to the relative-to-source voltage VGS falling below the threshold voltage −Vth (VGS≤−Vth<0), power transistor PTr is switched OFF. Namely, the normally-on-type power transistor PTr is switched OFF when the source voltage VS exceeds the absolute value Vth of the threshold value −Vth when the gate voltage VG is in a 0V state.

By reverse-phase controlling the gate voltage VG and the source voltage VS of the power transistor PTr, the drive circuit 10 controls the relative-to-source voltage VGS of the gate G in a range from VCC to −VCC (−VCC≤VGS≤VCC). The power transistor PTr is thereby accurately ON/OFF driven by controlling the relative-to-source voltage VGS of the gate G in the range from voltage VCC to voltage −VCC.

The voltage VCC becomes a voltage sufficiently high with respect to the absolute value Vth of the threshold potential −Vth. The drive circuit 10 makes the relative-to-source voltage VGS lower than the threshold voltage Vth by lowering the gate voltage VG of the power transistor PTr and raising the source voltage VS. The drive circuit 10 is accordingly capable of accurately switching the normally-on-type power transistor PTr OFF without employing a negative voltage power source.

Moreover, in order to switch OFF the power transistor PTr, the drive circuit 10 raises the source voltage VS by switching ON the transistor Mb and supplying the voltage VCC to the source S of the power transistor PTr. The drive circuit 10 is thereby capable of rapidly switching the power transistor PTr OFF.

As illustrated in FIG. 1, there is at least some parasitic inductance Lp present in the lines used for the leads 34 and the wire bonding of the power transistor PTr. As illustrated in FIG. 4, when the power transistor PTr is, for example, driven by rises and falls of several picoseconds to several nanoseconds, the parasitic inductance Lp generates an overpotential at the output terminal 26C of the drive circuit 10 (illustrated by double-dot intermittent lines in FIG. 4). Note that in the following this overpotential is referred to as spike voltage Sv. In FIG. 4 the voltage of the output terminal 26C of the drive circuit 10 is illustrated as the voltage VN of the node 40.

When voltage VIN of the power line 30 connected to the power transistor PTr is a high voltage (for example over 100 V to several hundred volt), current flowing through the parasitic inductance Lp increases and the spike voltage Sv is increased When the transistor Ma is switched OFF, the spike voltage Sv generated by switching ON the power transistor PTr is applied to the node 40 to which the drain D of the transistor Ma is connected. Damage occurs in the transistor Ma when the voltage VN of the node 40 exceeds the withstand voltage of the transistor Ma due to the spike voltage Sv.

In the drive circuit 10, the transistor Mb is provided between the node 40 to which the drain D of the transistor Ma is connected and the power line 20, and the transistor Mb is switched ON when the transistor Ma is switched OFF. The drive circuit 10 thereby adopts a conducting state between the power line 20 and the drain D of the transistor Ma (node 40) by switching ON the transistor Mb. In the drive circuit 10, when the voltage VN of the node 40 exceeds the voltage VCC (VCC≤Sv) due to spike voltage Sv, a current Io corresponding to the spike voltage Sv (see FIG. 1) flows from the node 40, through the transistor Mb to the power line 20. Thus in the drive circuit 10, even though the spike voltage Sv occurs, the drain D of the transistor Ma connected to the node 40 is clamped at voltage VCC.

Moreover, the capacitor 22 of the direct current power source section 16 is connected to the power line 20, and so even though the spike voltage Sv occurs, the voltage VCC suppressed from rising. The drive circuit 10 is accordingly capable of using the transistor Ma with a withstand voltage set based on the voltage VCC.

In the drive circuit 10, the power (energy) due to the spike voltage Sv is regenerated in the power line 20. The power from the spike voltage Sv is dissipated by the peripheral circuit 18 and the like by regeneration in the power line 20. The drive circuit 10 is thereby capable of utilizing the power corresponding to the spike voltage Sv arising from such causes as the parasitic inductance Lp, without energy being wasted.

Moreover, in the drive circuit 10, the transistor Mb is employed to suppress the spike voltage Sv, and not a Schottky barrier diode (SBD) or a Zenner diode. Thus by employing the transistor Mb, the drive circuit 10 can accordingly be formed to the integrated circuit 12 without employing a special process.

Moreover, the drive circuit 10 employs the PMOSFET transistor Mb in contrast to the NMOSFET transistor Ma. The drive circuit 10 is accordingly capable of accurately switching the transistor Ma OFF and the transistor Mb OFF, respectively, by inputting the single control signal Cs to the gate G of the transistor Ma and the gate G of the transistor Mb.

Second Exemplary Embodiment

Explanation follows regarding a second exemplary embodiment of technology disclosed herein. The basic configuration of the second exemplary embodiment is similar to that of the first exemplary embodiment, and so functional components in the second exemplary embodiment similar to those of the first exemplary embodiment are allocated the same reference numerals as those of the first exemplary embodiment, and further explanation is omitted thereof.

Figure 5:
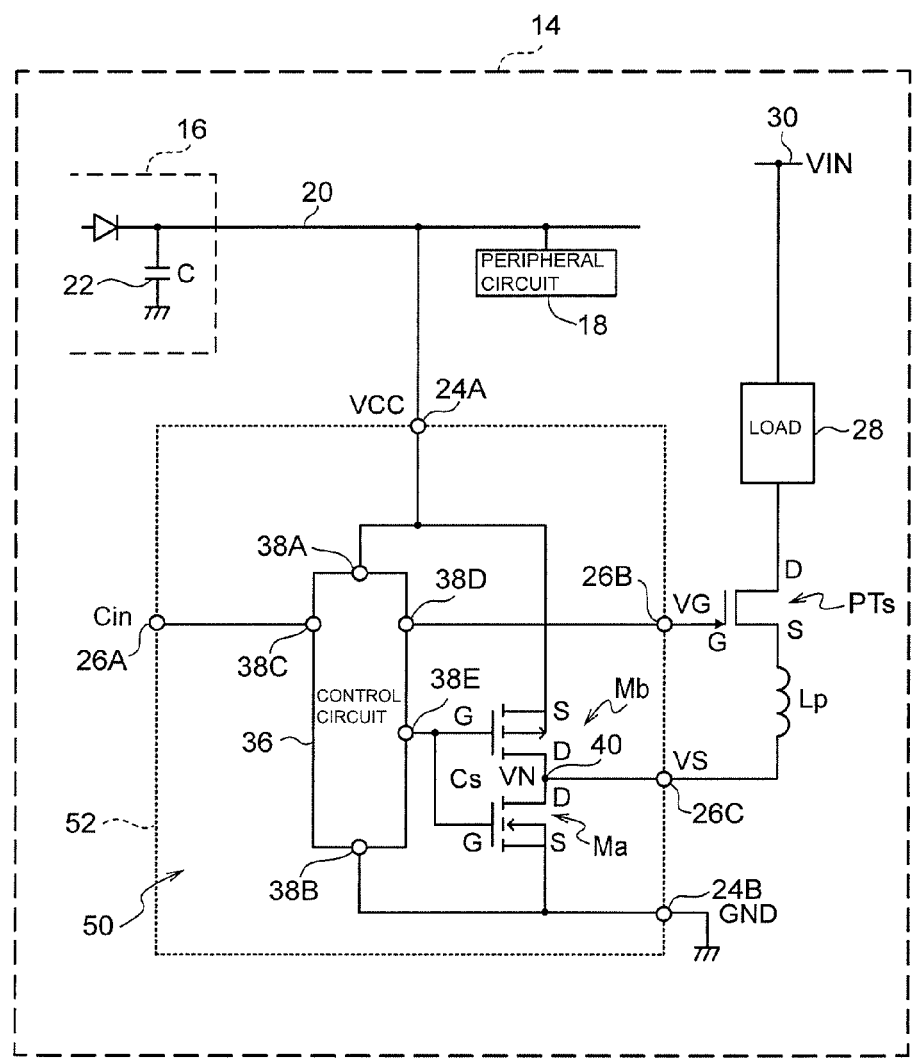
FIG. 5 is a circuit diagram illustrating an example of a drive circuit according to a second exemplary embodiment.

FIG. 5 illustrates a drive circuit 50 according to the second exemplary embodiment. In the drive circuit 50, each of the functional components is similar to those of the drive circuit 10 of the first exemplary embodiment, however it differs in that it is connected to a power transistor PTs. The power transistor PTs is employed in place of the power transistor PTr of the first exemplary embodiment. The power transistor PTs functions as an example of a first switching element in the second exemplary embodiment.

A normally-off-type transistor is applied in the power transistor PTs. The normally-off-type power transistor PTs has a threshold voltage Vth that is a positive voltage (0v<Vth<VCC). The power transistor PTs is accordingly switched OFF when the gate voltage G is at 0V.

Figure 6:
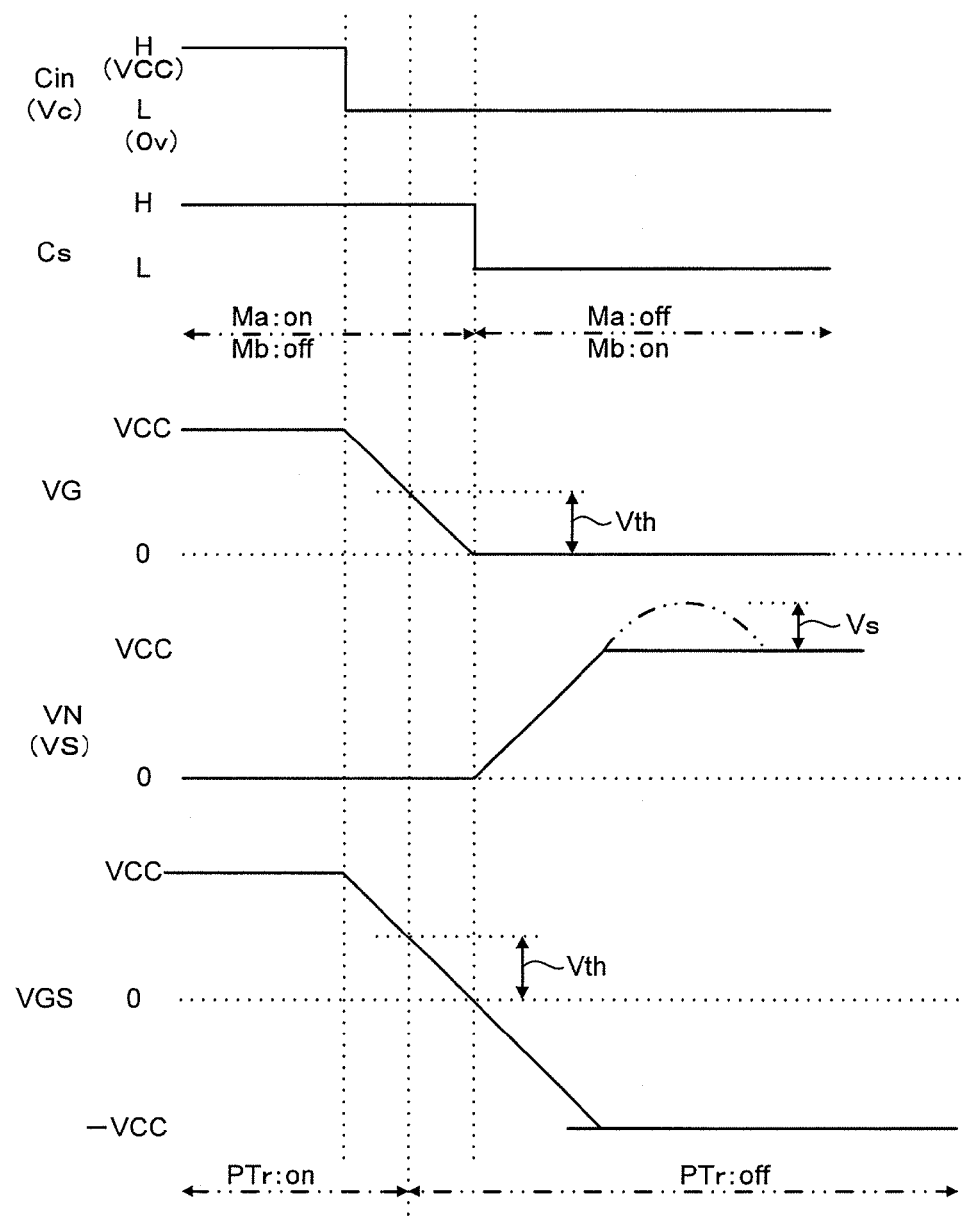
FIG. 6 is a timing chart illustrating an example of the actuation according to the drive circuit of the second exemplary embodiment.

Explanation follows regarding operation of the drive circuit 50 that drives the normally-off-type power transistor PTs. Note that a control voltage Vc output based on a drive signal Cin, and a source voltage VS corresponding to a voltage VN of a node 40 are indicated in brackets as illustrated in FIG. 6.

In the drive circuit 50, the control voltage Vc output from the control circuit 36 rises to VCC by the drive signal Cin being made "H" level, raising the gate voltage VG of the power transistor PTs to voltage VCC. In the control signal output section 46, the control signal Cs is H level due to the gate voltage VG becoming greater than 0V (for example VG=VCC), switching the transistor Mb OFF and the transistor Ma ON. The power transistor PTs is accordingly switched ON due to the relative-to-source voltage VGS of the gate G exceeding the threshold voltage Vth.

In the drive circuit 50, when the drive signal Cin becomes "L" level, the control voltage Vc output from the control circuit 36 to the gate G of the power transistor PTs is 0V. As illustrated in FIG. 6, the gate voltage VG of the power transistor PTs falls to 0V by the control voltage Vc becoming 0V. In the control circuit 36, when gate voltage VG detected by the gate voltage detector 44 falls to 0V (VG≤0V), the control signal output section 46 makes the control signal Cs "L" level.

When the source voltage VS is 0V, due to the threshold voltage Vth of the power transistor PTs being positive (0V<Vth<VCC), the power transistor PTs is switched OFF before the gate voltage VG reaches 0V. In the drive circuit 50, the transistor Ma is switched OFF and the transistor Mb is switched ON when the gate voltage VG becomes 0V.

A spike voltage Sv (indicated by the double-dot intermittent line in FIG. 6) may arise when the power transistor PTs is switched OFF and the transistor Ma is switched OFF. In the drive circuit 50, when the voltage VN of the node 40 (the drain D of the transistor Ma) exceeds the voltage VCC, a current Io flows through the transistor Mb to the power line 20. In the drive circuit 50, the voltage (voltage VN) of the drain D of the transistor Ma is suppressed from becoming higher than the voltage VCC by the current Io flowing to the power line 20.

The drive circuit 50 accordingly protects the transistor Ma and the like from the spike voltage Sv even when ON/OFF driving the normally-off-type power transistor PTs, and moreover regenerates the power of the spike voltage Sv in the power line 20.

In the first and second exemplary embodiments described above, the transistor Ma and the transistor Mb are switched ON/OFF by the single control signal Cs, however the transistor Ma and the transistor Mb may be switched ON/OFF at different timings to each other.

Third Exemplary Embodiment

Explanation follows regarding a third exemplary embodiment of technology disclosed herein. Note that the basic configuration of the third exemplary embodiment is similar to that of the first exemplary embodiment, and so functional components in the third exemplary embodiment similar to those of the first exemplary embodiment are allocated the same reference numerals as those of the first exemplary embodiment, and further explanation is omitted thereof.

Figure 7:
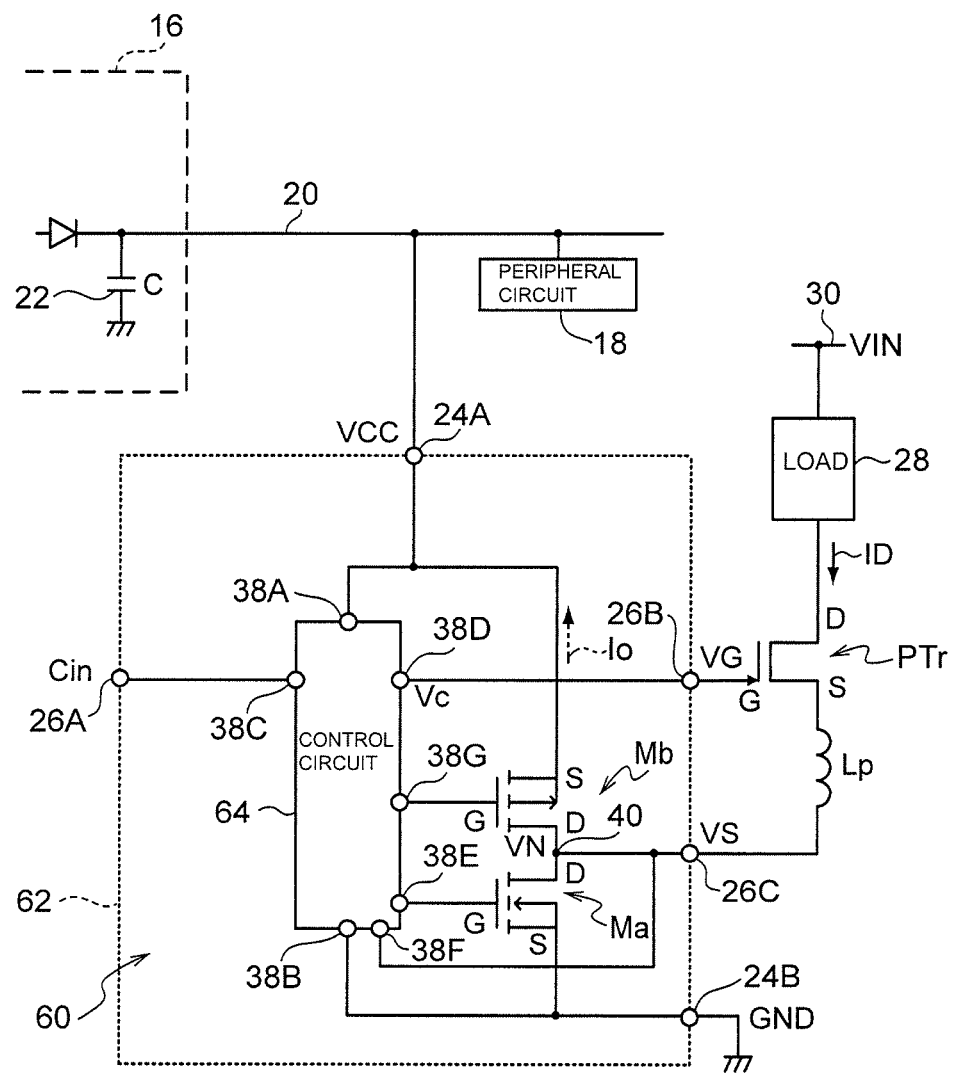
FIG. 7 is a circuit diagram illustrating an example of a drive circuit according to a third exemplary embodiment.

FIG. 7 illustrates a drive circuit 60 according to a third exemplary embodiment. The drive circuit 60 is formed to an integrated circuit 62. The drive circuit 60 functions as an example of a drive circuit in the third exemplary embodiment, and the integrated circuit 62 functions as an example of a semiconductor integrated circuit in the third exemplary embodiment.

The drive circuit 60 includes a control circuit 64. The control circuit 64 is employed in place of the control circuit 36 of the first exemplary embodiment. The control circuit 64 includes an input terminal 38F and an output terminal 38G in addition to the input terminal 38C and output terminals 38D, 38E. In the control circuit 64 the input terminal 38F is connected to the node 40 of the drive circuit 60 (between the node 40 and the output terminal 26C). In the control circuit 64 the voltage VN of the node 40 is input to the input terminal 38F. In the drive circuit 60, normally-the-voltage VN of the node 40 is at source voltage VS of the power transistor PTr.

In the control circuit 64 the output terminal 38E is connected to the gate G of the transistor Ma, and the output terminal 38G is connected to the gate G of the transistor Mb. Based on a gate voltage VG of the power transistor PTr, the control circuit 64 outputs a control signal Csa that performs ON/OFF control of the transistor Ma from the output terminal 38E to the transistor Ma. Based on the voltage VN of the node 40 that is the source voltage VS of the power transistor PTr, the control circuit 64 outputs a control signal Csb that performs ON/OFF control of the transistor Mb from the output terminal 38G to the transistor Mb.

Figure 8:
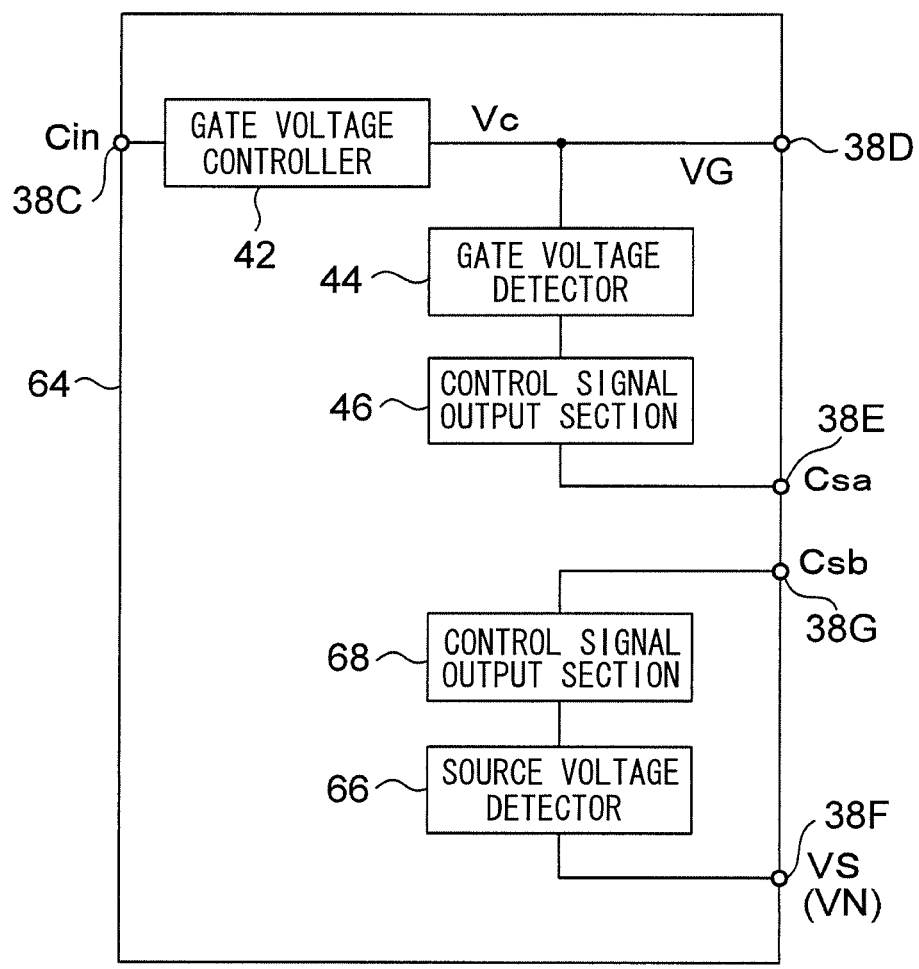
FIG. 8 is a functional block diagram illustrating an example of a control circuit according to a third exemplary embodiment.

FIG. 8 illustrates an example of a control circuit 64. The control circuit 64 includes a source voltage detector 66 and a control signal output section 68. The source voltage detector 66 is connected to an input terminal 38F, and detects a source voltage VS of the power transistor PTr input from the input terminal 38F. The control signal output section 68 outputs the control signal Csb corresponding to the source voltage VS of the power transistor PTr from the output terminal 38G to the gate G of the transistor Mb.

In the drive circuit 60, the source voltage VS of the power transistor PTr is raised by switching OFF the transistors Ma, Mb. The control signal output section 68 of the control circuit 64 outputs the control signal Csb that switches ON the transistor Mb, by the time the source voltage VS of the power transistor PTr reaches voltage VCC, for example.

The drive circuit 60 raises the control voltage Vc output from the control circuit 64 to the voltage VCC when the drive signal Cin becomes "H" level. The drive circuit 60 lowers the source voltage VS of the power transistor PTr by switching OFF the transistor Mb and switching ON the transistor Ma.

Figure 9:
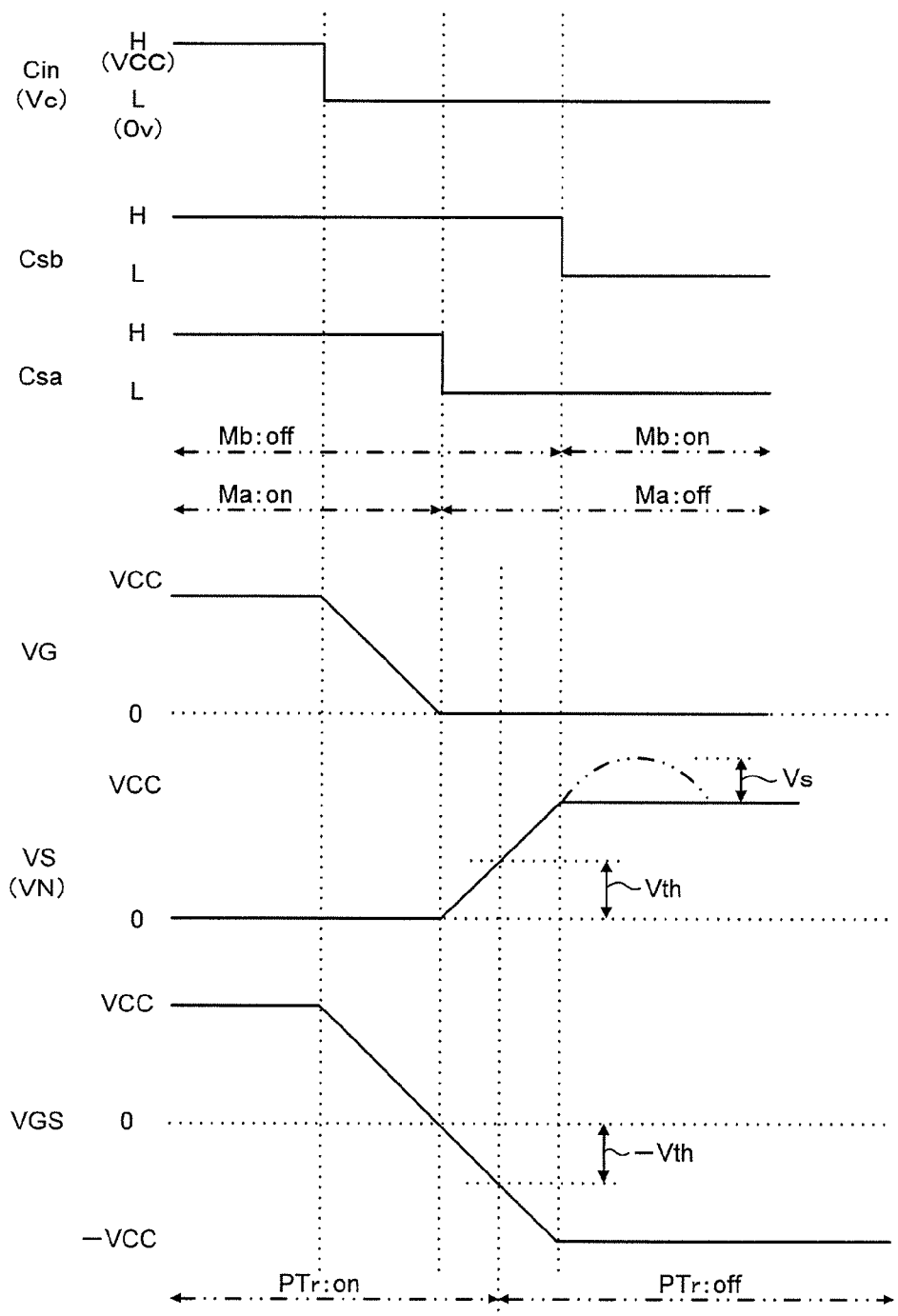
FIG. 9 is a timing chart illustrating an example of the actuation of the drive circuit according to the third exemplary embodiment.

The power transistor PTr is switched ON by raising the gate voltage VG and lowering the source voltage VS so as to raise the relative-to-source voltage VGS of the gate G In the drive circuit 60, the control voltage Vc output from the control circuit 64 to the gate G of the power transistor PTr is made 0V when the drive signal Cin becomes "L" level. As illustrated in FIG. 9, the gate voltage VG of the power transistor PTr is lowered so as to become 0V when the control voltage Vc becomes 0V. In the control circuit 64, when the gate voltage VG detected by the gate voltage detector 44 is lowered to 0V (VG≤0V), the control signal output section 46 makes the control signal Csa "L" level. Note that in FIG. 9, the control voltage Vc output based on the drive signal Cin and the source voltage VS corresponding to the voltage VN of the node 40 are indicated in brackets.

In the case where the threshold voltage Vth of the power transistor PTr is negative (−Vth, −VCC<−Vth<0V), the power transistor PTr is switched OFF by the relative-to-source voltage VGS of the gate G lowering to below the threshold value −Vth.

Moreover, in the control circuit 64 of the drive circuit 60, the control signal Csb is output to the gate G of the transistor Mb so as to switch ON the transistor Mb by the time the source voltage VS of the power transistor PTr reaches voltage VCC.

A spike voltage Sv may arise whilst the power transistor PTr is switched OFF and the transistor Ma is switched OFF. In the drive circuit 60, the transistor Mb is switched ON when the voltage VN of the node 40 corresponding to the source voltage VS reaches voltage VCC. The drive circuit 60 adopts a conductive state between the power line 20 and the node 40 by switching ON the transistor Mb.

In the drive circuit 60, a current Io flows through the transistor Mb to the power line 20 when the voltage VN of the node 40 exceeds the voltage VCC. In the drive circuit 60, the voltage (voltage VN) of the drain D of the transistor Ma is suppressed from becoming higher than the voltage VCC by the current Io flowing.

In the drive circuit 60, the transistor Ma and the like can be protected from the spike voltage Sv by switching ON the transistor Mb by the time the voltage VN of the node 40 reaches the voltage VCC after the transistor Ma has been switched OFF. In the drive circuit 60, the power of the spike voltage Sv is also regenerated in the power line 20 by switching ON the transistor Mb by the time the voltage VN of the node 40 reaches the voltage VCC.

Note that the drive circuit 60 may also be applied to driving normally-off-type power transistor PTs.

In the first to the third exemplary embodiments described above, the transistor Ma is switched OFF at a timing when the gate voltage VG has become "L" level (0V), however the timing when the transistor Ma switches OFF is not limited thereto. For example, the transistor Ma may be switched OFF in synchronization with the control voltage Vc becoming 0V. The transistor Ma may be switched OFF during the interval from when the gate voltage VG is lowered until the gate voltage VG reaches 0V.

Moreover, however although it is preferable for the transistor Mb to be switched ON to match switching OFF of the transistor Ma, and for the transistor Mb to be switched OFF to match switching ON of the transistor Ma, there is no limitation thereto. It is also preferable that the transistor Mb is not switched ON when the transistor Ma is ON, and the transistor Mb may be switched ON when the transistor Ma is switched OFF by the time the voltage of the drain D of the transistor Ma reaches the voltage VCC.

Moreover, the ON/OFF timings of the transistors Ma, Mb may be set based on the drive signal Cin. When the transistors Ma, Mb are switched ON/OFF based on the drive signal Cin, the transistors Ma, Mb may be switched ON/OFF synchronized to the control voltage Vc.

Moreover, when the transistors Ma, Mb are switched ON/OFF based on the drive signal Cin, the transistor Ma may be switched OFF and the transistor Mb may be switched ON with a delay of a specific duration with respect to switching the control voltage Vc OFF. Note that when the control voltage Vc is switched ON, the control voltage Vc is switched ON with a delay with respect to switching the transistor Ma ON and the transistor Mb OFF.

In the technology disclosed herein, the conduction element is an element equipped with a function to permit conduction when one electrical potential is higher than another electrical potential, and includes application to functional components. In the first to the third exemplary embodiment, the transistor Mb is employed as an example of a conduction element, however the conduction element is not limited thereto, and for example a silicon diode may be employed therefor.

Figure 10:
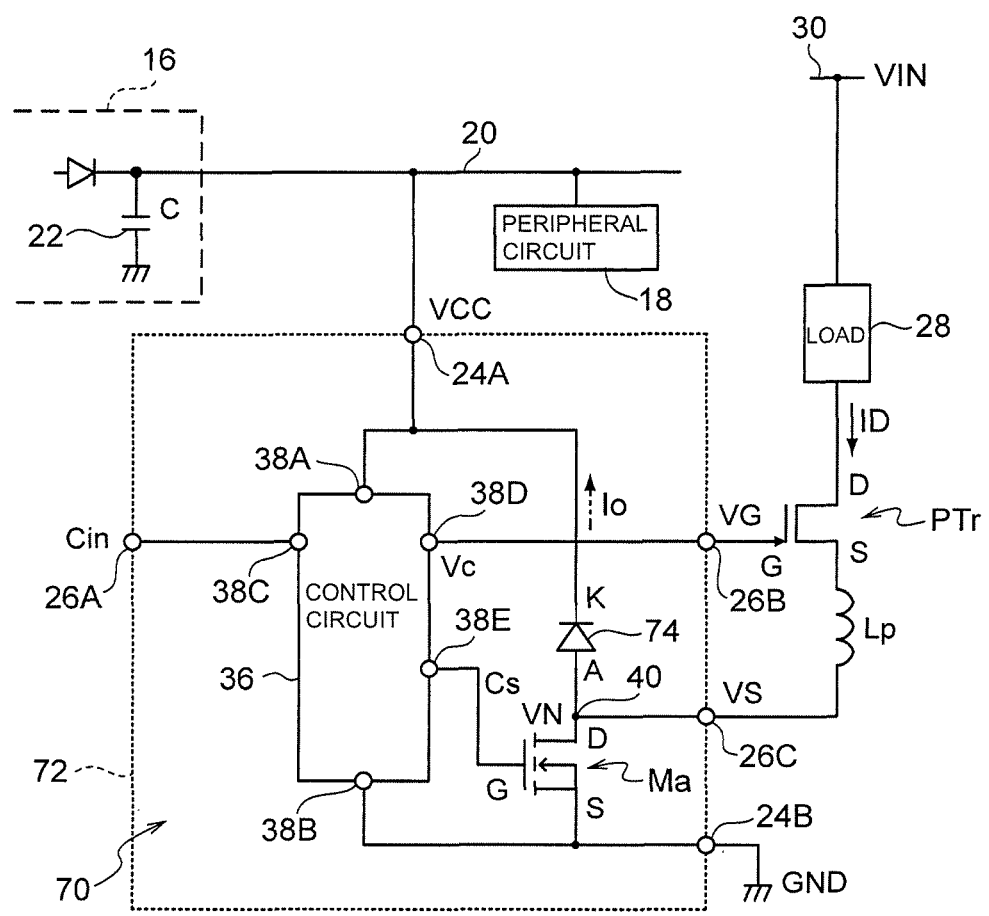
FIG. 10 is a circuit diagram illustrating an example of another drive circuit.

FIG. 10 illustrates a drive circuit 70. The drive circuit 70 is formed to an integrated circuit 72. The drive circuit 70 employs a silicon diode (referred to below as diode 74) in place of the transistor Mb of the drive circuit 10 in the first exemplary embodiment.

The cathode K of the diode 74, is connected to the power source terminal 24A, and the anode A of the diode 74 is connected to a node 40. The drive circuit 70 prevents current flowing using the diode 74 when the voltage VN of the node 40 is lower than the voltage VCC.

The drive circuit 70 permits a current Io to flow from the node 40 towards the power line 20 when the voltage VN of the node 40 has exceeded the voltage VCC, and the drive circuit 70 is in a conducting state. The drive circuit 70 employing the diode 74 accordingly suppresses the spike voltage Sv, and regenerates the power of the spike voltage Sv in the power line 20.

An aspect of the technology disclosed herein exhibits the advantageous effect of enabling an increase in power utilization to be achieved by regenerating in a power line the power of an overpotential occurring in the drain of a second switching element.

The technology disclosed herein is not limited by the above exemplary embodiments, and any embodiment may be implemented that includes the desired functions of each part. All cited documents, patent applications and technical standards mentioned in the present specification are incorporated by reference in the present specification to the same extent as if the individual cited documents, patent applications and technical standards were specifically and individually incorporated by reference in the present specification.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A drive circuit for driving a first switching element, comprising:
   a second switching element configured to be connected in series with a source of the first switching element, configured to be switched ON when the first switching element is switched ON, and configured to be switched OFF when the first switching element is switched OFF;
   a conduction element configured to be provided between a drain of the second switching element and a power line, and configured to connect the drain of the second switching element to the power line;
   a controller configured to perform ON/OFF control of the first switching element, the second switching element, and the conduction element; and
   a detection section configured to detect a source voltage of the first switching element, wherein
   the controller switches the conduction element ON in accordance with a detection result by the detection section.

2. The drive circuit of claim 1, wherein
   the conduction element includes a third switching element; and
   the controller is configured to perform ON/OFF control of the first switching element, the second switching element, and the third switching element in accordance with a drive signal of the first switching element.

3. The drive circuit of claim 2, wherein the controller controls a voltage output to a gate of the first switching element in accordance with a drive signal of the first switching element, switches the second switching element ON and the third switching element OFF when the first switching element is switched ON, and switches the second switching element OFF and the third switching element ON when the first switching element is switched OFF.

4. The drive circuit of claim 2, wherein the controller switches the third switching element ON after switching the second switching element OFF.

5. The drive circuit of claim 2, wherein the controller switches the second switching element OFF and switches the third switching element ON by lowering a gate voltage of the first switching element to a specified value.

6. The drive circuit of claim 1, wherein the first switching element is a normally-on-type switching element.

7. A semiconductor integrated circuit, comprising:
a drive circuit for driving a first switching element that includes:
a second switching element configured to be connected in series with a source of the first switching element, configured to be switched ON when the first switching element is switched ON, and configured to be switched OFF when the first switching element is switched OFF;
a conduction element configured to be provided between a drain of the second switching element and a power line, and configured to connect the drain of the second switching element to the power line;
a controller configured to perform ON/OFF control of the first switching element, the second switching element, and the conduction element; and
a detection section configured to detect a source voltage of the first switching element, wherein
the controller switches the conduction element ON in accordance with a detection result by the detection section.

8. The semiconductor integrated circuit of claim 7, wherein the conduction element includes a third switching element; and
the controller is configured to perform ON/OFF control of the first switching element, the second switching element, and the third switching element in accordance with a drive signal of the first switching element.

9. The semiconductor integrated circuit of claim 8, wherein the controller controls a voltage output to a gate of the first switching element in accordance with a drive signal of the first switching element, switches the second switching element ON and the third switching element OFF when the first switching element is switched ON, and switches the second switching element OFF and the third switching element ON when the first switching element is switched OFF.

10. The semiconductor integrated circuit of claim 8, wherein the controller switches the third switching element ON after switching the second switching element OFF.

11. The semiconductor integrated circuit of claim 8, wherein the controller switches the second switching element OFF and switches the third switching element ON by lowering a gate voltage of the first switching element to a specified value.

12. The semiconductor integrated circuit of claim 7, wherein the first switching element is a normally-on-type switching element.

13. A control method for a drive circuit for driving a first switching element, the control method comprising:
switching ON a second switching element configured to be connected in series with a source of the first switching element when the first switching element is switched ON;
switching OFF the second switching element when the first switching element is switched OFF; and
using a conduction element provided between a drain of the second switching element and a power line to connect the drain of the second switching element to the power line in accordance with a result of detecting the source voltage of the first switching element.

14. The control method of claim 13, wherein the conduction element includes a third switching element, and the drain of the second switching element is connected to the power line by switching ON the third switching element.

* * * * *